United States Patent
Byun et al.

(10) Patent No.: US 7,466,616 B2
(45) Date of Patent: Dec. 16, 2008

(54) BIT LINE SENSE AMPLIFIER AND METHOD THEREOF

(75) Inventors: Sang-Man Byun, Suwon-si (KR); Sang-Seok Kang, Suwon-si (KR); Jong-Hyoung Lim, Hwaseong-si (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 181 days.

(21) Appl. No.: 11/498,721

(22) Filed: Aug. 4, 2006

(65) Prior Publication Data
US 2007/0030748 A1 Feb. 8, 2007

(30) Foreign Application Priority Data
Aug. 5, 2005 (KR) .................... 10-2005-0071655

(51) Int. Cl.
*G11C 7/02* (2006.01)
(52) U.S. Cl. .................... 365/208; 365/205; 365/203
(58) Field of Classification Search .............. 365/208, 365/205, 203
See application file for complete search history.

(56) References Cited

U.S. PATENT DOCUMENTS

| 5,426,603 | A  | * | 6/1995 | Nakamura et al. | ........... 365/149 |
| 2004/0047189 | A1 | * | 3/2004 | Tran et al. | .................. 365/200 |
| 2008/0031054 | A1 | * | 2/2008 | Lehmann et al. | ....... 365/189.02 |

FOREIGN PATENT DOCUMENTS

| JP | 08-007569 | 1/1996 |
| JP | 09-330591 | 12/1997 |
| JP | 11-039896 | 2/1999 |
| KR | 439037 | 6/2004 |

OTHER PUBLICATIONS

Korean Office Action issued Jun. 28, 2006 for Korean Patent Application No. 10-2005-0071655.

* cited by examiner

*Primary Examiner*—Tuan T. Nguyen
(74) *Attorney, Agent, or Firm*—Harness Dickey & Pierce

(57) ABSTRACT

A bit line sense amplifier and method thereof are provided. The example bit line sense amplifier may include a sense amplifying circuit coupled between a first bit line and a second bit line. The sense amplifying circuit may be configured to amplify a voltage difference between the first bit line and the second bit line. The example bit line sense amplifier may further include a power supply voltage providing circuit configured to provide a first power supply voltage and a second power supply voltage to the sense amplifying circuit in response to first and second bit line sensing control signals. The bit line sense amplifier may further include a bit line voltage compensation circuit configured to prevent a voltage-reduction at the first bit line and the second bit line for a delay period, the delay period including at least a period of time after a pre-charging of the first and second bit lines, in response to one or more of the first and second bit line sensing control signals.

16 Claims, 4 Drawing Sheets

300

BIT LINE SENSE AMPLIFIER AND METHOD THEREOF

PRIORITY STATEMENT

This application claims priority under 35 USC § 119 to Korean Patent Application No. 2005-71655, filed on Aug. 5, 2005, the contents of which are herein incorporated by reference in its entirety.

BACKGROUND OF THE INVENTION

1. Field of the Invention

Example embodiments of the present invention relate generally to a bit line sense amplifier and method thereof, and more particularly to a bit line sense amplifier and method of amplifying voltage.

2. Description of the Related Art

Conventional semiconductor memory devices may operate at relatively low power supply voltages and at higher speeds, which may complicate manufacturing processes of the semiconductor memory devices. However, test conditions during memory tests of conventional semiconductor memory devices may be configured based on older semiconductor memory devices, which may typically operate at higher power supply voltages and lower speeds. The legacy test conditions used in conventional memory tests may create a number of "false-positives" (i.e., non-defective units treated as defective units).

FIG. 1 is a circuit diagram illustrating a conventional dynamic random-access memory (DRAM) device 100.

Referring to FIG. 1, the DRAM device 100 may include pairs of bit lines BL1, BL1B, BL2, BL2B, BL3 and BL3B, word lines WL0 and WL1, memory cells CELL1 through CELL6 and bit line sense amplifiers 1, 2, and 3. While the above-listed elements are illustrated as included within the conventional DRAM device 100, it is understood that additional memory cells and/or bit line sense amplifiers may be included in a real-world implementation of the DRAM 100 of FIG. 1. Generally, as the DRAM device 100 becomes more highly integrated, a distance between the bit lines may become lower. Accordingly, parasitic bridge resistors BR1 to BR4 may be positioned between the bit lines due to the decreased bit line separation.

FIG. 2 is a circuit diagram illustrating another conventional DRAM device 200 including a sense amplifier connected to a pair of bit lines.

Referring to FIG. 2, the DRAM device 200 may include a memory cell CELL1, pre-charge circuits 11 and 12, bit line sense amplifiers 15 and 16 and a data input/output (I/O) circuit 17. The DRAM device 200 may further include a p-type metal-oxide semiconductor (PMOS) transistor 18 for providing a power supply voltage VCCA to the bit line sense amplifier 15, and an n-type metal-oxide semiconductor (NMOS) transistor for providing a ground voltage VSS to the bit line sense amplifier 16.

A conventional process for testing the DRAM 200 will now be described.

Referring to FIG. 2, the pair of bit lines BL1 and BL1B (not shown, e.g., see FIG. 1) may be separated into a pair of array bit lines BL1_A and BL1B_A and a pair of sense bit lines BL1_S and BL1B_S. Isolation control circuits 13 and 14 may electrically connect the pair of array bit lines BL1_A and BL1B_A and the pair of sense bit lines BL1_S and BL1B_S, respectively, in response to isolation control signals ISOL and ISOR.

Referring to FIG. 2, the pair of sense bit lines BL1_S and BL1B_S may be pre-charged by the pre-charge circuits 11 and 12 to a voltage VBL. The voltage VBL may typically be set to half of a memory cell array power supply voltage.

Referring to FIG. 2, if the pre-charge operation is completed and a word line WL is activated such that a transistor in the memory cell CELL1 is turned on, data of the memory cell may be outputted to the pair of array bit lines BL1_A and BL1B_A. If transistors configuring the isolation control circuits 13 and 14 are turned on, signals of the pair of array bit lines BL1_A and BL1B_A may be respectively transferred to the pair of sense bit lines BL1_S and BL1B_S. A cell capacitor may share charge with the bit lines BL1_A and BL1_S. If bit line sensing control signals LANG and LAPG are enabled after the charge is sufficiently shared, signals of the pair of sense bit lines BL1_S and BL1B_S may be amplified by sense amplifiers 15 and 16.

However, in a test mode, the bit line sensing control signals LANG and LAPG may not be enabled until a relatively long period after the pair of sense bit lines BL1_S and BL1B_S is pre-charged and data of the memory cell CELL1 is transferred to the pair of sense bit lines BL1_S and BL1B_S via the charge sharing process. Thus, pre-charge control signals EQR and EQL may be in a disabled state because the pre-charging operation may already have been completed. As described with reference to FIG. 1, a leakage current may flow through the parasitic bridge resistors BR1 to BR4, which may be positioned between adjacent bit lines. Therefore, a voltage level of the pair of sense bit lines BL1_S and BL1B_S may be reduced (e.g., below a voltage threshold) before the bit line sensing control signals LANG and LAPG are enabled after the pair of sense bit lines BL1_S and BL1B_S is pre-charged. Consequently, the reduced voltage level may not be sensed by the sense amplifier.

In the testing operation described above with respect to FIG. 2, non-defective DRAM devices may be treated as defective in the bit line test, and a production yield may thereby be reduced.

SUMMARY OF THE INVENTION

An example embodiment of the present invention is directed to a bit line sense amplifier, including a sense amplifying circuit coupled between a first bit line and a second bit line, and configured to amplify a voltage difference between the first bit line and the second bit line, a power supply voltage providing circuit configured to provide a first power supply voltage and a second power supply voltage to the sense amplifying circuit in response to first and second bit line sensing control signals and a bit line voltage compensation circuit configured to limit a voltage reduction at the first bit line and the second bit line for a delay period, the delay period including at least a period of time after a pre-charging of the first and second bit lines, in response to one or more of the first and second bit line sensing control signals.

Another example embodiment of the present invention is directed to a method of amplifying voltage, including pre-charging a first bit line and a second bit line, outputting memory cell data to one of the first bit line and the second bit line, selectively providing supplementary currents to a sense amplifying circuit, such that the pre-charged first and second bit lines do not fall below a given voltage threshold for a given time period after the pre-charging, in response to first and second bit line sensing control signals and amplifying signals of the first bit line and the second bit line by using the sense amplifying circuit.

Another example embodiment of the present invention is directed to a semiconductor memory device capable of testing bit lines accurately and enhancing production yield.

Another example embodiment of the present invention is directed to a method of bit line sensing for the semiconductor memory device capable of testing bit lines accurately and enhancing production yield.

Another example embodiment of the present invention is directed to a bit line sense amplifier includes a sense amplifying circuit, a power supply voltage providing circuit and a bit line voltage compensation circuit.

BRIEF DESCRIPTION OF THE DRAWINGS

The accompanying drawings are included to provide a further understanding of the invention, and are incorporated in and constitute a part of this specification. The drawings illustrate example embodiments of the present invention and, together with the description, serve to explain principles of the present invention.

DETAILED DESCRIPTION OF EXAMPLE EMBODIMENTS OF THE PRESENT INVENTION

Hereinafter, example embodiments of the present invention will be explained in detail with reference to the accompanying drawings.

It will be understood that, although the terms first, second, etc., may be used herein to describe various elements, these elements should not be limited by these terms. These terms are used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.)

The terminology used herein is for the purpose of describing particular example embodiments and is not intended to be limiting of the invention. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Figure 3:
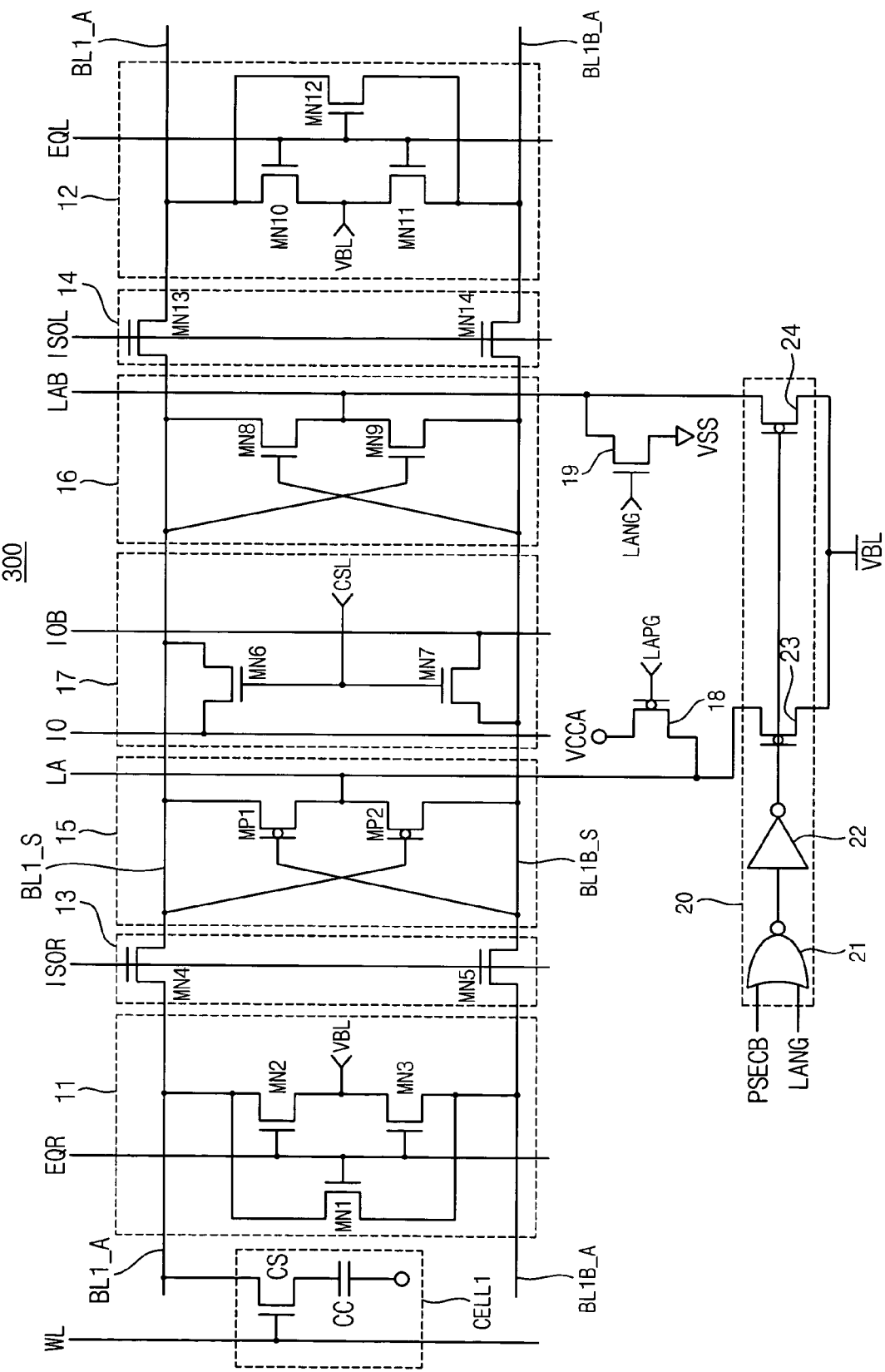
FIG. 3 is a circuit diagram illustrating a dynamic random-access memory (DRAM) device having a sense amplifier connected to a pair of bit lines according to an example embodiment of the present invention.

FIG. 3 is a circuit diagram illustrating a dynamic random-access memory (DRAM) device 300 having a sense amplifier connected to a pair of bit lines according to an example embodiment of the present invention.

In the example embodiment of FIG. 3, the DRAM device 300 may include a memory cell CELL1, pre-charge circuits 11 and 12, bit line sense amplifiers 15 and 16 and a data input/output (I/O) circuit 17. The DRAM device 300 of FIG. 3 may further include a p-type metal-oxide semiconductor (PMOS) transistor 18, an n-type metal-oxide semiconductor (NMOS) transistor 19, a bit line voltage compensation circuit 20 and isolation control circuits 13 and 14.

In the example embodiment of FIG. 3, the memory cell CELL1 may include a cell capacitor CC and a cell transistor CS. If a word line WL is enabled, the cell transistor CS may be turned on such that an array bit line BL1_A and the cell capacitor CC may be electrically connected. Charges stored in the cell transistor CS may be outputted to the array bit line BL1_A.

In the example embodiment of FIG. 3, the pre-charge circuit 11 may include NMOS transistors MN1 through MN3, and the pre-charge circuit 12 may include NMOS transistors MN10 through MN12. If a pre-charge control signal EQR is enabled, the NMOS transistors MN2 and MN3 may be turned on, and a voltage VBL (e.g., which may be set to a voltage level being half that of an array power supply voltage VCCA) may be applied to the array bit line BL1_A and an array bit line BL1B_A, respectively. The NMOS transistor MN1 may equalize the array bit line BL1_A and the array bit line BL1B_A. Likewise, if the pre-charge control signal EQL is enabled, the NMOS transistors MN10 and MN11 may be turned on, and the voltage VBL (e.g., which may be set to a voltage level being half that of an array power supply voltage VCCA) may be applied to the array bit line BL1_A and the array bit line BL1B_A, respectively. The NMOS transistor MN12 may equalize the array bit line BL1_A and the array bit line BL1B_A.

In the example embodiment of FIG. 3, if the isolation control signal ISOR is set to a first logic level (e.g., a higher logic level or logic "1"), NMOS transistors MN4 and MN5 in the isolation control circuit 13 and NMOS transistors MN13 and MN14 in the isolation control circuit 14 may be set to an active or "on" state. Thus, if the pre-charge control signals EQR and EQL are enabled, a sense bit line BL1_S and a sense bit line BL1B_S may also be pre-charged to the level of the voltage VBL.

In the example embodiment of FIG. 3, the bit line sense amplifier 15 may include PMOS transistors MP1 and MP2, and the bit line sense amplifier 16 may include NMOS transistors MN8 and MN9. The data I/O circuit 17 may include NMOS transistors MN6 and MN7. In an example, the NMOS transistors MN6 may electrically connect the sense bit line BL1_S to an I/O line IO if a column selection signal CSL is set to the first logic level (e.g., a higher logic level or logic "1"), and the NMOS transistors MN7 may electrically connect the sense bit line BL1B_S to an I/O line IOB if the column selection signal CSL is set to the first logic level. Therefore, signals on the sense bit lines BL1_S and BL1B_S may be transferred to the I/O lines IO and IOB, respectively, if the column selection signal CSL is set to the first logic level.

In the example embodiment of FIG. 3, the NMOS transistor 19 may provide a ground voltage VSS to a line LAB if a bit line sensing control signal LANG is set to the first logic level (e.g., a higher logic level or logic "1") and the PMOS transistor 18 may provide the array power supply voltage VCCA to a line LA if a bit line sensing control signal LAPG is set to a second logic level (e.g., a lower logic level or logic "0"). In an example, the bit line sensing control signal LAPG may be an inverted signal of the bit line sensing control signal LANG.

In the example embodiment of FIG. 3, the bit line voltage compensation circuit 20 may include a NOR gate 21, an inverter 22 and PMOS transistors 23 and 24. The NOR gate 21 may perform NOR operations on a sensing enable signal PSECB and the bit line sensing control signal LANG. The inverter 22 may invert an output signal of the NOR gate 21. The PMOS transistor 23 may provide the voltage VBL (e.g., which may be set to a voltage level being half that of an array power supply voltage VCCA) to the line LA if an output signal of the inverter 22 is set to the second logic level. The PMOS transistor 24 may provide the voltage VBL to the line LAB if the output signal of the inverter 22 is set to the second logic level. Accordingly, if the sensing enable signal PSECB is set to the second logic level and the bit line sensing control signal LANG is also set to the second logic level, the PMOS transistors 23 and 24 may be turned on and may provide the voltage VBL (e.g., which may be set to a voltage level being half that of an array power supply voltage VCCA) to the sense amplifiers 15 and 16 through the lines LA and LAB, respectively.

Figure 4:
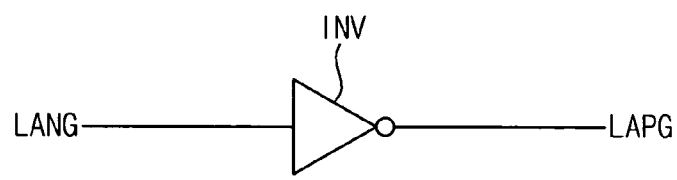
FIG. 4 is a circuit diagram illustrating a relationship between control signals in the DRAM device of FIG. 3 according to an example embodiment of the present invention.

FIG. 4 is a circuit diagram illustrating a relationship between the control signals LAPG and LANG in the DRAM device 300 of FIG. 3 according to an example embodiment of the present invention. As shown in the example embodiment of FIG. 4, an inverter INV may invert the bit line sensing control signal LANG to generate the bit line sensing control signal LAPG.

Figure 5:
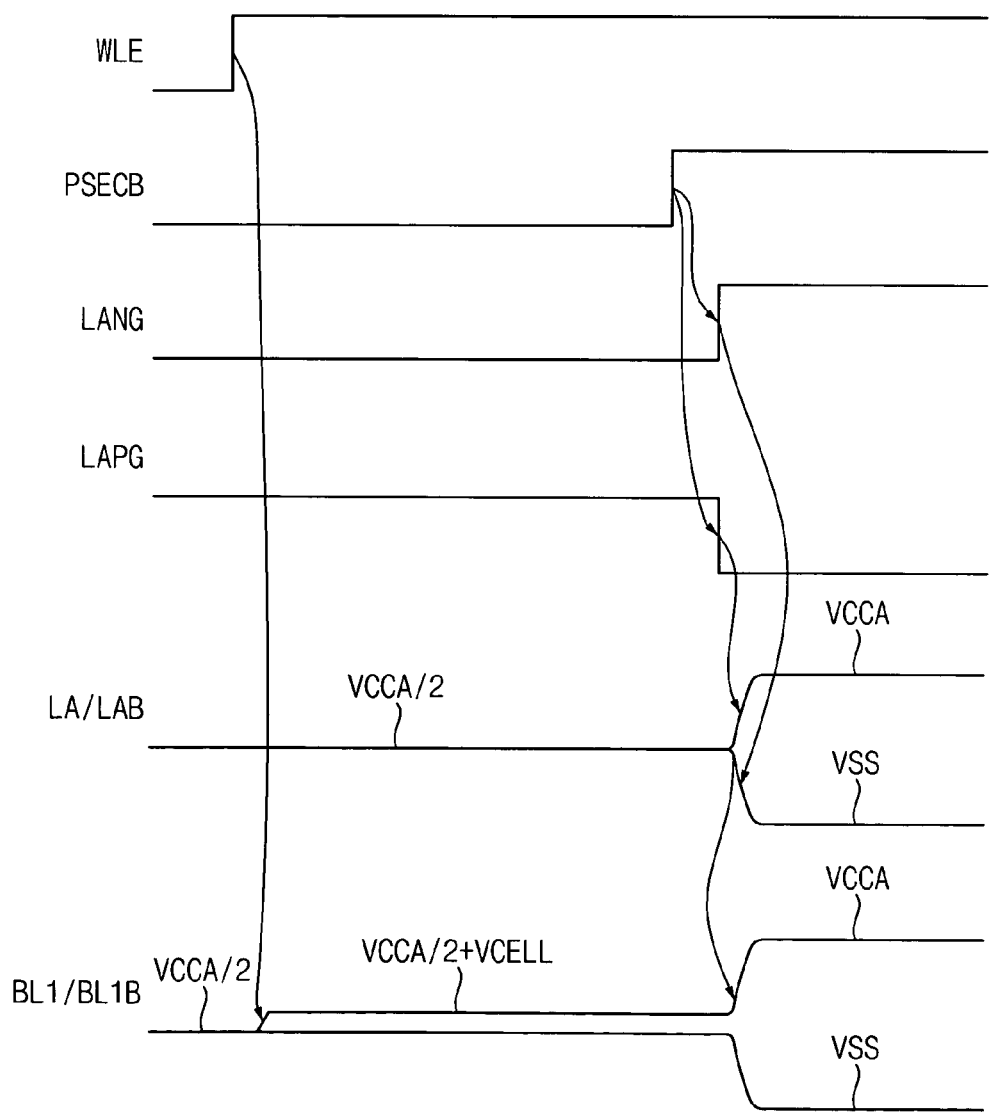
FIG. 5 is a timing diagram illustrating signals during an operation of the DRAM device of FIG. 3.

FIG. 5 is a timing diagram illustrating signals during an operation of the DRAM device 300 of FIG. 3. Hereinafter, example operation of the DRAM 300 will be described with reference to FIG. 3, FIG. 4 and FIG. 5.

In example operation of the DRAM 300 of FIG. 3, in a normal operation mode and with reference to FIGS. 3 through 5, the NMOS transistors MN4 and MN5 of the isolation control circuit 13 and the NMOS transistors MN13 and MN14 of the isolation control circuit 14 may be turned on in response to the isolation control signals ISOR and ISOL. If the pre-charge control signals EQR and EQL are enabled, the array bit line BL1_A and the array bit line BL1B_A may be pre-charged to the level of the voltage VBL. The sense bit line BL1_S and the sense bit line BL1B_S may also be pre-charged to the level of the voltage VBL (e.g., which may be set to a voltage level being half that of an array power supply voltage VCCA).

In example operation of the DRAM 300 of FIG. 3, in a normal operation mode and with reference to FIGS. 3 through 5, after the pre-charging operation, the sense bit line BL1_S and the sense bit line BL1B_S may be maintained at the level of the voltage VBL. If the word line WL is enabled and cell data is outputted to the sense bit line BL1_S, a voltage of the sense bit line BL1_S may become a voltage corresponding to a sum of the voltage VBL and a voltage VCELL, which may reflect the cell charge, and a voltage of the sense bit line BL1B_S may be maintained at the level of the voltage VBL.

In example operation of the DRAM 300 of FIG. 3, in a normal operation mode and with reference to FIGS. 3 through 5, if the bit line sensing control signals LANG and LAPG are enabled, the array power supply voltage VCCA may be applied to drains of the PMOS transistor MP1 through the PMOS transistor 18 and the line LA, the ground voltage VSS may be applied to drains of the NMOS transistor MN9 through the NMOS transistor 19 and the line LAB. Because a voltage at a gate of the PMOS transistor MP1 within the sense amplifier 15 may be lower than a voltage at a source of the PMOS transistor MP1, the PMOS transistor MP1 may be turned on and the voltage of the sense bit line BL1_S may be set to the array power supply voltage VCCA. Likewise, because a voltage at a gate of the NMOS transistor MN9 within the sense amplifier 16 may be higher than a voltage at a source of the NMOS transistor MN9, the NMOS transistor MN9 may be turned on and the voltage of the sense bit line BL1B_S may be set to the ground voltage VSS.

In example operation of the DRAM 300 of FIG. 3, in a normal operation mode and with reference to FIGS. 3 through 5, the voltage of the sense bit line BL1_S may be set to the array power supply voltage VCCA and the voltage of the sense bit line BL1B_S may be set to the ground voltage VSS such that a voltage difference between the two conjugate bit lines BL1_S and BL1B_S may correspond to the array power supply voltage VCCA. Further, in the normal operation mode, the bit line voltage compensation circuit 20 may not affect an operation of the DRAM device 300 because the PMOS transistors 23 and 24, which may be included in the bit line voltage compensation circuit 20, may remain in an inactive or "off" state.

Figure 1:
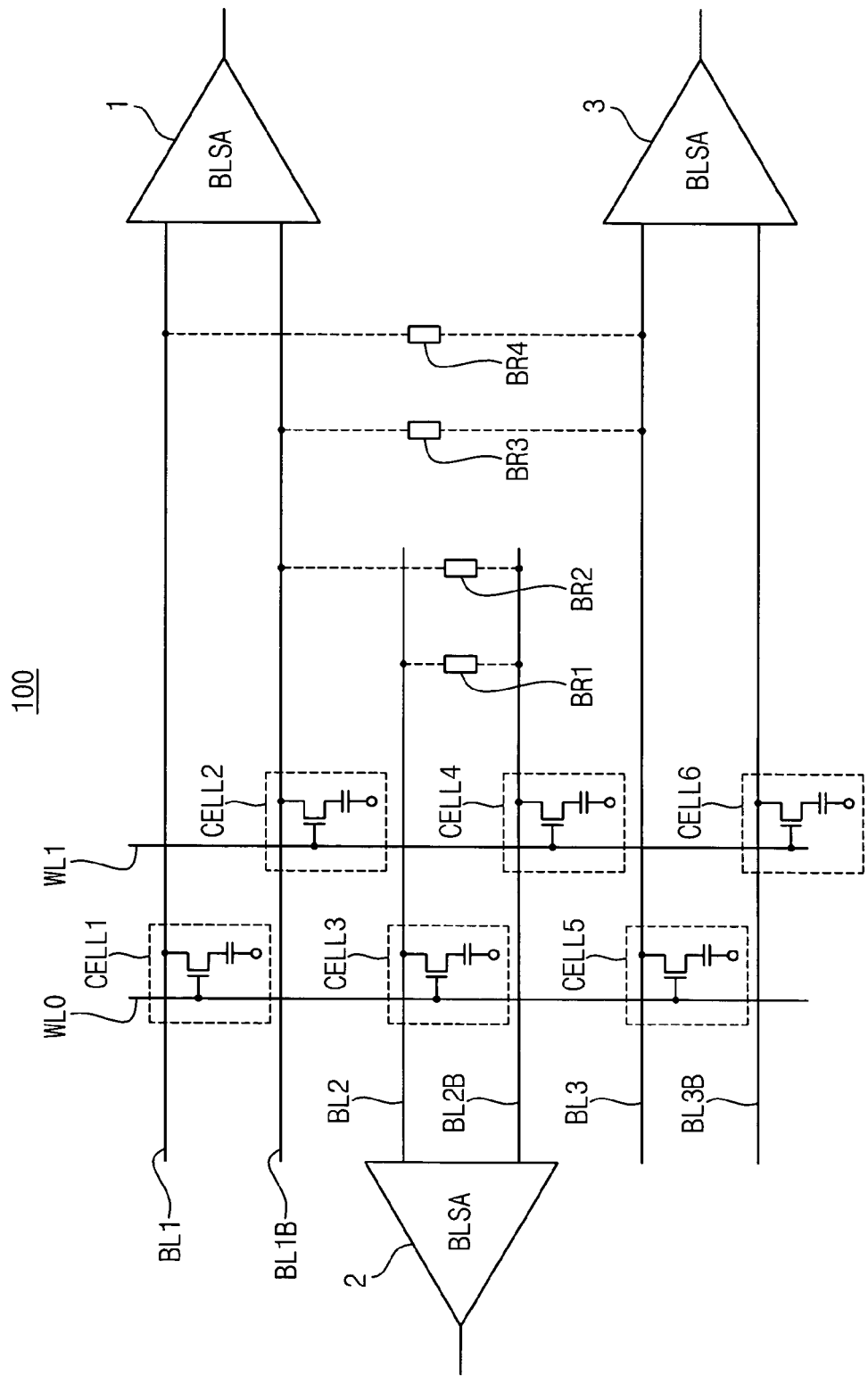
FIG. 1 is a circuit diagram illustrating a conventional dynamic random-access memory (DRAM) device.
Figure 2:
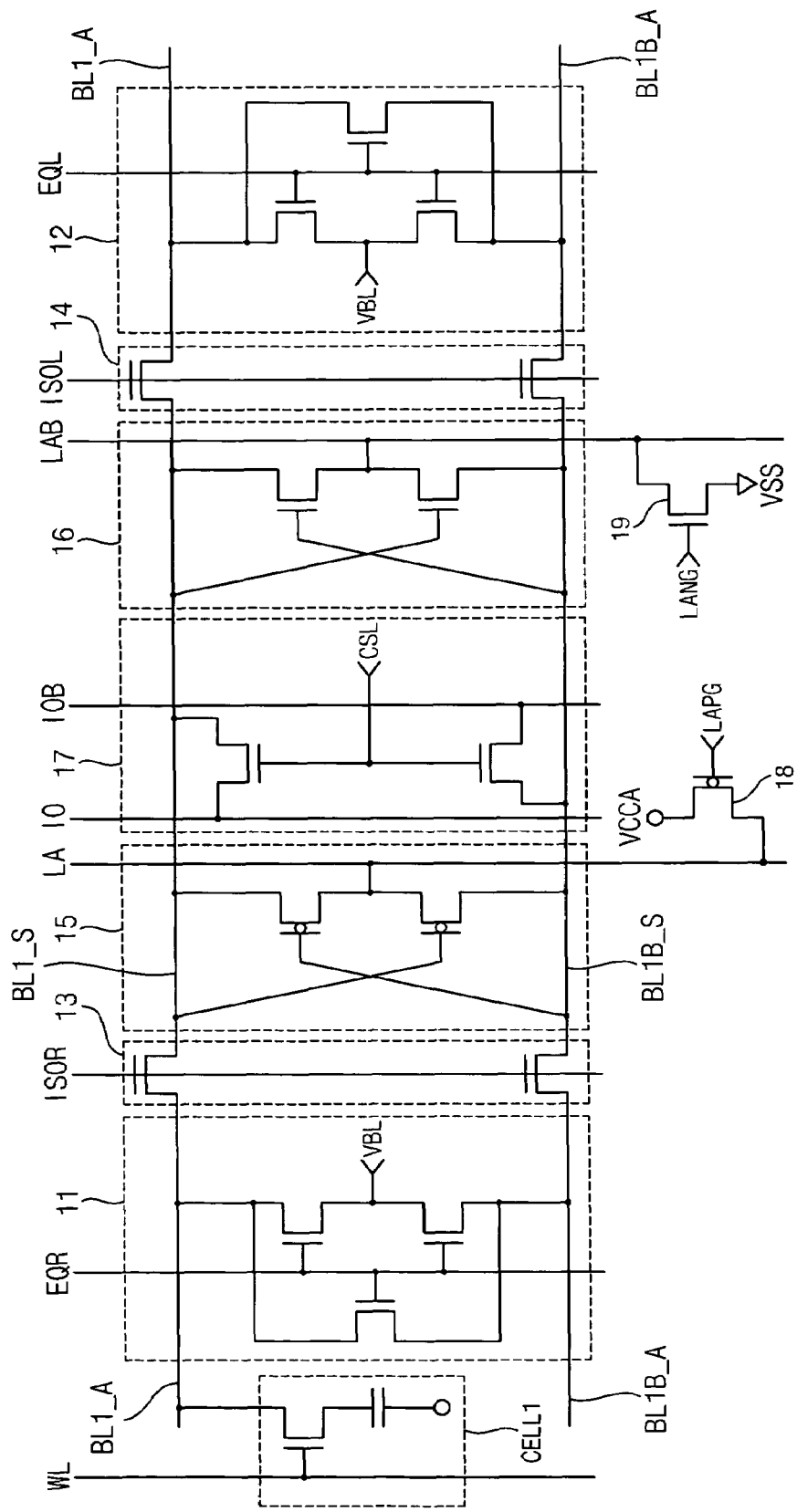
FIG. 2 is a circuit diagram illustrating a conventional DRAM device including a sense amplifier connected to a pair of bit lines.

In example operation of the DRAM 300 of FIG. 3, in a test mode and with reference to FIGS. 3 through 5, the bit line sensing control signals LANG and LAPG may be enabled a given time period after the pair of sense bit lines BL1_S and BL1B_S is pre-charged and data of the memory cell CELL1 are transferred to the pair of sense bit lines BL1_S and BL1B_S via the charge sharing process. The pre-charge control signals EQR and EQL may be disabled (e.g., set to an inactive or "off" state by being maintained at the second logic level) (e.g., because the pre-charging operation has already completed). As described above with reference to conventional art FIG. 1, a leakage current may flow through parasitic bridge resistors positioned between adjacent bit lines. Therefore, in conventional DRAM devices, a voltage level of a pair of sense bit lines BL1_S and BL1B_S may be gradually reduced until bit line sensing control signals LANG and LAPG are enabled after the pair of sense bit lines BL1_S and BL1B_S is pre-charged. Consequently, the voltage level may not be sensed by the conventional sense amplifier.

In another example embodiment of the present invention, referring to the DRAM 300 of FIG. 3, by including the bit line voltage compensation circuit 20, a voltage level of the pair of sense bit lines BL1_S and BL1B_S may have a lower probability of being reduced (e.g., below a voltage sensing threshold below which the sense amplifier may not be capable of sensing a voltage) before a sensing operation of the voltage of the pair of sense bit lines BL1_S and BL1B_S begins after the pair of sense bit lines BL1_S and BL1B_S is pre-charged. Therefore, the DRAM 300 may be capable of more accurately testing for defects of the bit lines because the chance of obtaining a false-positive (e.g., interpreting a non-defective DRAM as defect) may be reduced at the expense of increasing a waiting time or period during a memory test (e.g., a period before the sensing operation of the voltage of the pair of sense bit lines BL1_S and BL1B_S begins after the pair of sense bit lines BL1_S and BL1B_S is pre-charged).

In example operation of the DRAM 300 of FIG. 3, with reference to FIGS. 3 through 5, if a word line enable signal WLE is enabled after the bit line is pre-charged to the level of the voltage VBL (e.g., VCCA/2), the voltage of the bit line may be changed to a voltage corresponding to a sum of a voltage of cell data VCELL and the voltage VCCA/2. Because the cell data undergoes charge sharing between the cell capacitor CC and the bit line BL1, the voltage of cell data VCELL added to the voltage VCCA/2 of the bit line BL1 may be less than an original voltage of the data within the cell capacitor CC. If the sensing enable signal PSECB is set to the first logic level (e.g., a first logic level or logic "1"), the bit line sensing control signal LANG may be set to the first logic level and the bit line sensing control signal LAPG may be set to the second logic level (e.g., a lower logic level or logic "0"). If the bit line sensing control signal LAPG is set to the second logic level, a voltage of the line LA may be changed from the voltage VCCA/2 to the voltage VCCA. If the bit line sensing control signal LANG is set to the first logic level, a voltage of the line LAB may be changed from the voltage VCCA/2 to the voltage VSS. The voltages of the pair of bit lines BL1 and BL1B may be amplified to the voltages VCCA and VSS by the bit line sense amplifiers 15 and 16, respectively.

In example operation of the DRAM 300 of FIG. 3, with reference to FIGS. 3 through 5, the bit line voltage compensation circuit 20 included in the DRAM device 300 may provide the voltage VCCA/2 to the bit line sense amplifiers 15 and 16 before the sensing/amplifying operations. Thus, the DRAM device 300 may prevent the voltage level of the pair of bit lines BL1 and BL1B from being reduced (e.g., below a voltage sensing threshold) (e.g., at least until a sensing operation of the voltage of the pair of bit lines BL1 and BL1B begins after the pair of bit lines BL1 and BL1B is pre-charged).

Example embodiments of the present invention being thus described, it will be obvious that the same may be varied in many ways. For example, it is understood that the above-described first and second logic levels may correspond to a higher logic level and a lower logic level, respectively, in an example embodiment of the present invention. Alternatively, the first and second logic levels/states may correspond to the lower logic level and the higher logic level, respectively, in other example embodiments of the present invention.

Further, while above-described example embodiments of the present invention are described as directed to DRAMs, it is understood that other example embodiments of the present invention may be employed in conjunction with any type of memory device (e.g., ROMs, etc.).

Such variations are not to be regarded as a departure from the spirit and scope of example embodiments of the present invention, and all such modifications as would be obvious to one skilled in the art are intended to be included within the scope of the following claims.

What is claimed is:

1. A bit line sense amplifier, comprising:
   a sense amplifying circuit coupled between a first bit line and a second bit line, and configured to amplify a voltage difference between the first bit line and the second bit line;
   a power supply voltage providing circuit configured to provide a first power supply voltage and a second power supply voltage to the sense amplifying circuit in response to first and second bit line sensing control signals; and
   a bit line voltage compensation circuit configured to limit a voltage reduction at the first bit line and the second bit line for a delay period, the delay period including at least a period of time after a pre-charging of the first and second bit lines, in response to one or more of the first and second bit line sensing control signals.

2. The bit line sense amplifier of claim 1, wherein the bit line voltage compensation circuit prevents the voltages of the first bit line and the second bit line from being reduced, by providing supplementary currents to the sense amplifying circuit if one or more of the first and second bit line sensing control signals are disabled.

3. The bit line sense amplifier of claim 1, wherein the sense amplifying circuit includes:
   a first sense amplifying circuit coupled between the first bit line and the second bit line, and configured to amplify a signal on the first bit line; and
   a second sense amplifying circuit coupled between the first bit line and the second bit line, and configured to amplify a signal on the second bit line.

4. The bit line sense amplifier of claim 3, wherein the power supply voltage providing circuit includes:
   a first switching circuit configured to provide the first power supply voltage to the second sense amplifying circuit in response to the first bit line sensing control signal; and
   a second switching circuit configured to provide the second power supply voltage to the first sense amplifying circuit in response to the second bit line sensing control signal.

5. The bit line sense amplifier of claim 4, wherein the second bit line sensing control signal is an inverted version of the first bit line sensing control signal.

6. The bit line sense amplifier of claim 4, wherein the first power supply voltage is a ground voltage and the second power supply voltage is a voltage applied to a memory cell array.

7. The bit line sense amplifier of claim 4, wherein at least one of the first switching circuit and the second switching circuit includes a metal-oxide semiconductor (MOS) transistor.

8. The bit line sense amplifier of claim 7, wherein the first switching circuit includes an n-type MOS (NMOS) transistor and the second switching circuit includes a p-type MOS (PMOS) transistor.

9. The bit line sense amplifier of claim 1, wherein the bit line voltage compensation circuit includes a MOS transistor that is switched in response to the one of the first and second bit line sensing control signals to provide a third power supply voltage to the sense amplifying circuit.

10. The bit line sense amplifier of claim 9, wherein the third power supply voltage is higher than the first power supply voltage and lower than the second power supply voltage.

11. The bit line sense amplifier of claim 10, wherein the third power supply voltage is an average value of the first and second power supply voltages.

12. The bit line sense amplifier of claim 1, wherein the bit line voltage compensation circuit includes:
   an OR gate configured to perform an OR operation on one of the first and second bit line sensing enable signals and the bit line sensing control signal; and
   a MOS transistor configured to provide a third power supply voltage to the sense amplifying circuit in response to an output signal of the OR gate.

13. A semiconductor memory device, comprising:

the bit line sense amplifier of claim 1;

a memory cell configured to output data to a first one of the first bit line and the second bit line, and configured to store data from a second one of the first bit line or the second bit line in response to a word line enable signal;

a pre-charging circuit configured to pre-charge the first bit line and the second bit line to a given voltage level; and an input/output circuit configured to output signals at the first bit line and the second bit line to a pair of input/output lines in response to a column selection signal, the output signals corresponding to signals amplified by the sense amplifying circuit.

14. A method of amplifying voltage, comprising:

pre-charging a first bit line and a second bit line;

outputting memory cell data to one of the first bit line and the second bit line;

selectively providing supplementary currents to a sense amplifying circuit, such that the pre-charged first and second bit lines do not fall below a given voltage threshold for a given time period after the pre-charging, in response to first and second bit line sensing control signals; and amplifying signals of the first bit line and the second bit line by using the sense amplifying circuit.

15. The method of claim 14, further comprising:

providing a first power supply voltage and a second power supply voltage to the sense amplifying circuit in response to the first and second bit line sensing control signals; and outputting the amplified signals at the first bit line and the second bit line.

16. The method of claim 14, wherein the given voltage threshold is a threshold below which the sense amplifying circuit cannot sense a difference between voltages at the first and second bit lines.

* * * * *